United States Patent
Li et al.

(10) Patent No.: US 10,627,940 B2
(45) Date of Patent: Apr. 21, 2020

(54) TOUCH SUBSTRATE AND DISPLAY DEVICE

(71) Applicant: BOE TECHNOLOGY GROUP CO., LTD., Beijing (CN)

(72) Inventors: Changfeng Li, Beijing (CN); Haisheng Wang, Beijing (CN); Yingming Liu, Beijing (CN); Xiaoliang Ding, Beijing (CN); Rui Xu, Beijing (CN); Lijun Zhao, Beijing (CN); Pengcheng Lu, Beijing (CN); Wei Liu, Beijing (CN); Yanling Han, Beijing (CN); Pinchao Gu, Beijing (CN); Yunke Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/081,182

(22) PCT Filed: Jan. 4, 2018

(86) PCT No.: PCT/CN2018/071164
§ 371 (c)(1),
(2) Date: Aug. 30, 2018

(87) PCT Pub. No.: WO2018/130110
PCT Pub. Date: Jul. 19, 2018

(65) Prior Publication Data
US 2019/0025971 A1    Jan. 24, 2019

(30) Foreign Application Priority Data
Jan. 10, 2017   (CN) .......................... 2017 1 0015676

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/042* (2013.01); *G06F 3/047* (2013.01); *G06F 3/0416* (2013.01);
(Continued)

(58) Field of Classification Search
CPC ........................................................ G06F 3/042
See application file for complete search history.

(56) References Cited

U.S. PATENT DOCUMENTS

2005/0200293 A1   9/2005  Naugler et al.
2011/0037729 A1   2/2011  Cho et al.
(Continued)

FOREIGN PATENT DOCUMENTS

CN          1922470 A       2/2007
CN        102663986 A       9/2012
(Continued)

OTHER PUBLICATIONS

First Office Action for Chinese Patent Application No. 201710015676.1 dated Jan. 25, 2019.
(Continued)

*Primary Examiner* — Joseph R Haley
(74) *Attorney, Agent, or Firm* — Calfee, Halter & Griswold LLP

(57) ABSTRACT

A touch substrate and a display device. The touch substrate includes a substrate; and a touch unit and a light emitting unit disposed on the substrate successively. An orthographic projection of the touch unit and that of the light emitting unit on the substrate at least partially overlap.

17 Claims, 2 Drawing Sheets

(51) Int. Cl.
*G06F 3/047* (2006.01)
*G06F 3/042* (2006.01)
(52) U.S. Cl.
CPC ........ *H01L 27/323* (2013.01); *H01L 27/3276* (2013.01); *G06F 2203/04103* (2013.01); *H01L 27/3234* (2013.01)

(56) References Cited

U.S. PATENT DOCUMENTS

| | | | |
|---|---|---|---|
| 2011/0050642 A1* | 3/2011 | Lee | G02F 1/167 345/175 |
| 2012/0092302 A1* | 4/2012 | Imai | G06F 3/0412 345/175 |
| 2012/0146953 A1 | 6/2012 | Yi et al. | |
| 2013/0201085 A1* | 8/2013 | Chang | G09G 3/3258 345/76 |
| 2017/0075450 A1 | 3/2017 | Wang et al. | |
| 2018/0284933 A1 | 10/2018 | Xu et al. | |
| 2019/0025971 A1 | 1/2019 | Li et al. | |

FOREIGN PATENT DOCUMENTS

| | | |
|---|---|---|
| CN | 105045435 A | 11/2015 |
| CN | 106505090 A | 3/2017 |
| CN | 106708326 A | 5/2017 |
| TW | 201106231 A | 2/2011 |

OTHER PUBLICATIONS

Search Report and Written Opinion for International Application No. PCT/CN2018/071164 dated Mar. 30, 2018.

* cited by examiner

TOUCH SUBSTRATE AND DISPLAY DEVICE

CROSS REFERENCE TO RELATED APPLICATIONS

The present application is the U.S. national phase entry of PCT/CN2018/071164, with an international filing date of Jan. 4, 2018, which claims the benefit of Chinese Patent Application No. 201710015676.1, filed on Jan. 10, 2017, the entire disclosures of which are incorporated herein by reference.

TECHNICAL FIELD

The present disclosure relates to the field of display technologies, and specifically to a touch substrate and a display device.

BACKGROUND

Touch screens have become the main human-machine interaction means for personal mobile communication devices, integrated information terminals (e.g., tablet computers, smart phones) and super laptops due to their advantages such as easy operability, intuitive operation, and flexibility.

On the other hand, organic light emitting diode (OLED) displays, as a high-end consumer product, are one of the hotspots in the field of flat panel display research. Compared with liquid crystal displays (LCDs), OLED displays have advantages such as low power consumption, low production cost, self-light emission, wide viewing angle, fast response, and so on. Therefore, they are widely used at present in mobile phones, PDAs, digital cameras, etc. and have begun to replace the conventional liquid crystal displays.

SUMMARY

According to an exemplary embodiment of the present disclosure, there is provided a touch substrate, including: a substrate; and a touch unit and a light emitting unit disposed on the substrate successively. An orthographic projection of the touch unit and an orthographic projection of the light emitting unit on the substrate at least partially overlap.

According to some embodiments of the present disclosure, a number of the touch units is plural, each of the touch units including a read transistor and a photosensitive device, a first terminal of the read transistor being connected to the photosensitive device, a second terminal of the read transistor being connected to a read signal line, a control terminal of the read transistor being connected to a driving signal line.

According to some embodiments of the present disclosure, the photosensitive device includes a second electrode, a photosensitive layer and a first electrode disposed successively on the substrate, and the touch substrate further includes an insulating layer disposed on the first electrode of the photosensitive device, the first terminal of the read transistor being connected to the first electrode of the photosensitive device through a via penetrating the insulating layer.

According to some embodiments of the present disclosure, the plurality of touch units is arranged in an array. Control terminals of the read transistors of the touch units located in a same row are connected to a same driving signal line, and second terminals of the read transistors of the touch units located in a same column are connected to a same read signal line.

According to some embodiments of the present disclosure, the touch substrate further includes a plurality of gate lines and a plurality of data lines that intersect and are insulated from each other, and a plurality of pixel driving units disposed in areas defined by intersections. Each of the pixel driving units is connected to a corresponding gate line, data line, and light emitting unit, and outputs a data signal input on the data line to the light emitting unit under control of a control signal input by the gate line so as to drive the light emitting unit to emit light.

According to some embodiments of the present disclosure, the pixel driving unit is located between the light emitting unit and the photosensitive device.

According to some embodiments of the present disclosure, the pixel driving unit includes a switching transistor and a driving transistor, the switching transistor and the driving transistor each including a first terminal, a second terminal and a control terminal, the control terminal of the switching transistor and the control terminal of the driving transistor being in a same layer as the control terminal of the read transistor, the first and second terminals of the switching transistor and the first and second terminals of the driving transistor being in a same layer as the first and second terminals of the read transistor, and an active layer of the switching transistor and an active layer of the driving transistor being in a same layer as an active layer of the read transistor.

According to some embodiments of the present disclosure, the data lines are disposed in a same layer as the read signal lines, and the gate lines are disposed in a same layer as the driving signal lines.

According to some embodiments of the present disclosure, the light emitting unit is an organic electroluminescent diode.

According to another exemplary embodiment of the present disclosure, there is provided a display device including any of the touch substrates described above.

According to yet another exemplary embodiment of the present disclosure, there is provided a method for manufacturing a touch substrate, including: providing a substrate; providing a touch unit on the substrate; and providing a light emitting unit above the touch unit. An orthographic projection of the touch unit and an orthographic projection of the light emitting unit on the substrate at least partially overlap.

According to some embodiments of the present disclosure, the providing the touch unit on the substrate includes providing a read transistor and a photosensitive device, with a first terminal of the read transistor being connected to the photosensitive device, a second terminal of the read transistor being connected to a read signal line, and a control terminal of the read transistor being connected to a driving signal line.

According to some embodiments of the present disclosure, the providing the photosensitive device includes disposing a second electrode, a photosensitive layer, a first electrode on the substrate successively. The method further includes: providing an insulating layer on the first electrode of the photosensitive device; and disposing in the insulating layer a via penetrating the insulating layer so as to connect the second terminal of the read transistor to the first terminal of the photosensitive device.

According to some embodiments of the present disclosure, the method further includes providing a pixel driving unit between the light emitting unit and the photosensitive device, the pixel driving unit including a switching transistor and a driving transistor. A control terminal of the switching transistor, a control terminal of the driving transistor, and the control terminal of the read transistor are formed in a same process step. A first terminal and a second terminal of the switching transistor, a first terminal and a second terminal of the driving transistor, and the first terminal and the second terminal of the read transistor are formed in a same process step. An active layer of the switching transistor, an active layer of the driving transistor, and an active layer of the read transistor are formed in a same process step.

According to some embodiments of the present disclosure, the method further includes: providing a plurality of gate lines and a plurality of data lines that intersect and are insulated from each other; and providing a plurality of driving signal lines and a plurality of read signal lines. A plurality of the touch units is arranged in an array, control terminals of the read transistors of the touch units located in a same row are connected to a same driving signal line, second terminals of the read transistors of the touch units located in a same column are connected to a same read signal line, the data lines and the read signal lines are formed in a same process step, and the gate lines and the driving signal lines are formed in a same process step.

DETAILED DESCRIPTION

Figure 1:
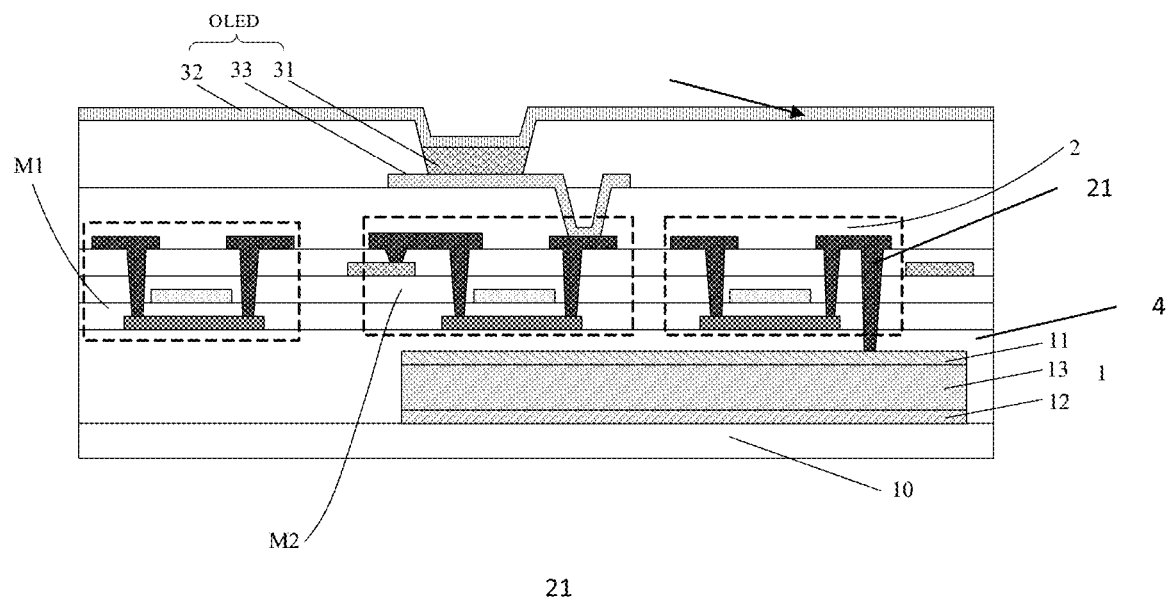
FIG. 1 is a schematic structural view of a touch substrate according to an embodiment of the present disclosure.

To enable those skilled in the art to have better understanding of the technical solutions of the present disclosure, the present disclosure will be further described in detail below in conjunction with the accompanying drawings and specific embodiments.

The following reference numerals are used in the description of the drawings and specific embodiments below:

10—substrate; 1—photosensitive device; 11—first electrode; 12—second electrode; 13—photosensitive layer; 2—read transistor; 31—anode; 32—cathode; 33—luminescent material; 4—driving signal line; 5—read signal line; M1—switching transistor; M2—driving transistor; C1—storage capacitor; OLED—organic electroluminescent diode; Gate—gate line; Data—data line; VDD—first power supply terminal; VSS—second power supply terminal.

The inventors have found that in an existing OLED display, OLED display device structures (e.g., light emitting units) are usually fabricated first, and then touch function devices (e.g., touch units) are fabricated separately. In order not to affect normal display, the orthographic projection of the OLED display device and that of the touch function device on the substrate basically do not overlap. However, in such an OLED display, the added touch function device will cause a decrease in the aperture ratio of the OLED display and hence limit the resolution of the OLED display.

An embodiment of the present disclosure provides a touch substrate, which includes, as shown in FIG. 1, a substrate 10, and a touch unit and a light emitting unit disposed successively on the substrate 10. The orthographic projection of the touch unit and that of the light emitting unit on the substrate 10 at least partially overlap.

The light emitting unit may, for example, be an organic light emitting diode (OLED) device as shown in FIG. 1, which includes an anode 31, a cathode 32, and a luminescent material 33 disposed between the anode 31 and the cathode 32.

The touch unit may, for example, include a read transistor 2 and a photosensitive device 1. The photosensitive device 1 includes a first electrode 11, a second electrode 12, and a photosensitive layer 13 disposed between the first electrode 11 and the second electrode 12. For example, the photosensitive layer 13 may include a PIN junction or an organic photosensitive material, etc.

Further, as shown in FIG. 1, the photosensitive device 1 and the read transistor 2 in each touch unit are disposed successively in a direction away from the substrate 10, and an insulating layer 4 is disposed between the photosensitive device 1 and the read transistor 2. A second terminal 21 of the read transistor 2 is connected to the first electrode 11 of the photosensitive device 1 through a via penetrating the insulating layer 4.

It is to be noted that although in the embodiment shown in FIG. 1 the present disclosure is illustrated based on an example in which the light emitting unit is an OLED and the touch unit includes a read transistor and a photosensitive device, the light emitting unit and the touch unit may be of other structures, as known to those skilled in the art.

In an exemplary embodiment, the touch units are periodically disposed in the display area of a display panel, i.e., an area where the light emitting units are located. The touch units may each correspond to a plurality of light emitting units arranged in a matrix without the need to be in one-to-one correspondence with the light emitting units. The arrangement of the touch units may be set by those skilled in the art according to actual need so as to achieve the desired touch precision. Likewise, the arrangement of the light emitting units may also be set by those skilled in the art according to actual need so as to achieve the desired display resolution.

With the above touch substrate being applied to a display panel, light emitted by the light emitting units is reflected by a user's finger and returns to the touch units, and the touch units determine the position touched by the user's finger based on the intensity of the received light so as to achieve the touch function.

In the touch substrate provided by an embodiment of the present disclosure, the light emitting units are located above the touch units. That is, in preparing the touch substrate, unlike the conventional technique of preparing the light emitting units first and then preparing the touch units, the touch units may be prepared first, and then the light emitting units are prepared. Therefore, the orthographic projection of the touch unit and that of the light emitting unit on the substrate can overlap without affecting the display function of the touch substrate, and thus the aperture ratio and the resolution of the touch substrate can be improved.

Specifically, the touch substrate includes a plurality of gate lines and a plurality of data lines that intersect and are insulated from each other. Each of the intersections of the plurality of gate lines and the plurality of data lines defines a pixel region, and each pixel region is provided with a pixel driving unit and a light emitting unit. Each pixel driving unit is connected to a corresponding gate line, data line, and light emitting unit, and outputs a data voltage input on the data line to the light emitting unit under control of a control signal input by the gate line so as to drive the light emitting unit to emit light.

Figure 2:
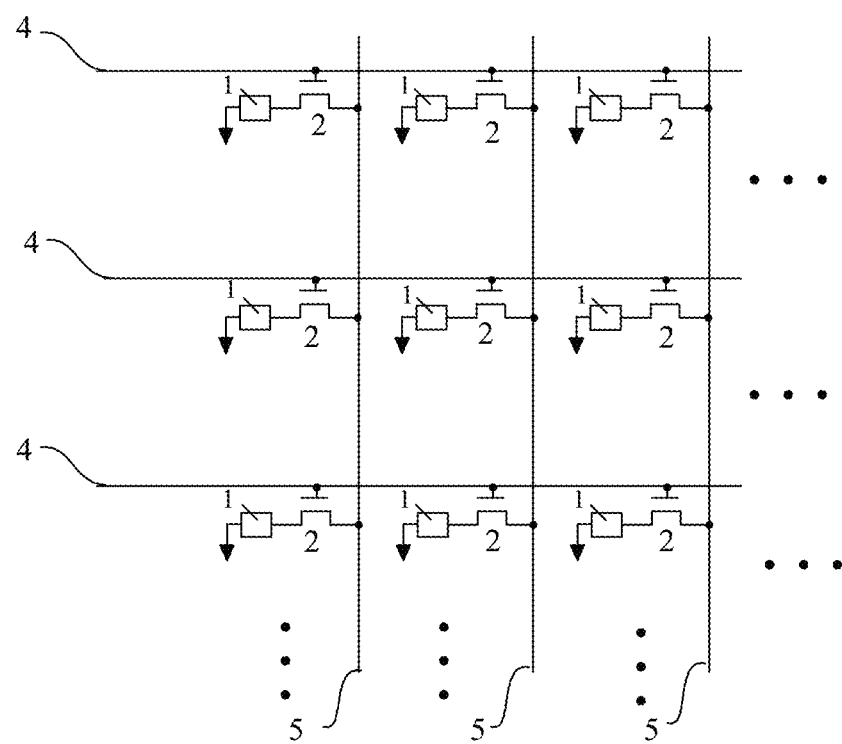
FIG. 2 is a schematic view illustrating the arrangement of touch units in a touch substrate according to another embodiment of the present disclosure.

The touch substrate further includes touch units located between the substrate and the light emitting units. As shown in FIG. 2, the touch units are arranged in an array, each of which includes a photosensitive device 1 and a read transistor 2 and is connected to a corresponding driving signal line 4 and read signal line 5. The photosensitive device 1 is configured to sense the intensity of light emitted by the light emitting units and reflected back by a user's finger, and convert the optical signal into an electrical signal. When an active signal is applied to the driving signal line 4, the read transistor 2 is turned on, so that the electric signal generated by the photosensitive device 1 is transferred to the read signal line 5 through the read transistor 2. By reading the electrical signal on each read signal line 5, the touch position on the touch substrate can be determined.

Specifically, in a touch recognition phase, the driving signal lines 4 are scanned progressively, and the read signal lines 5 are read sequentially. When an N-th row driving signal line 4 is scanned, if the data read by an M-th column read signal line 5 is at a high level due to the influence of the light reflected by the finger, it can be determined that touch is received at the intersection of the N-th row driving signal line 4 and the M-th column read signal line 5. Touch detection of the entire touch screen can be realized by scanning all the driving signal lines 4 progressively and reading all the read signal lines 5 sequentially.

The term "active signal" as used herein refers to an electrical signal that is capable of bringing a read transistor into conduction. For example, if the read transistor is a P-type transistor, the active signal is a low level signal; if the read transistor is an N-type transistor, the active signal is a high level signal.

Figure 3:
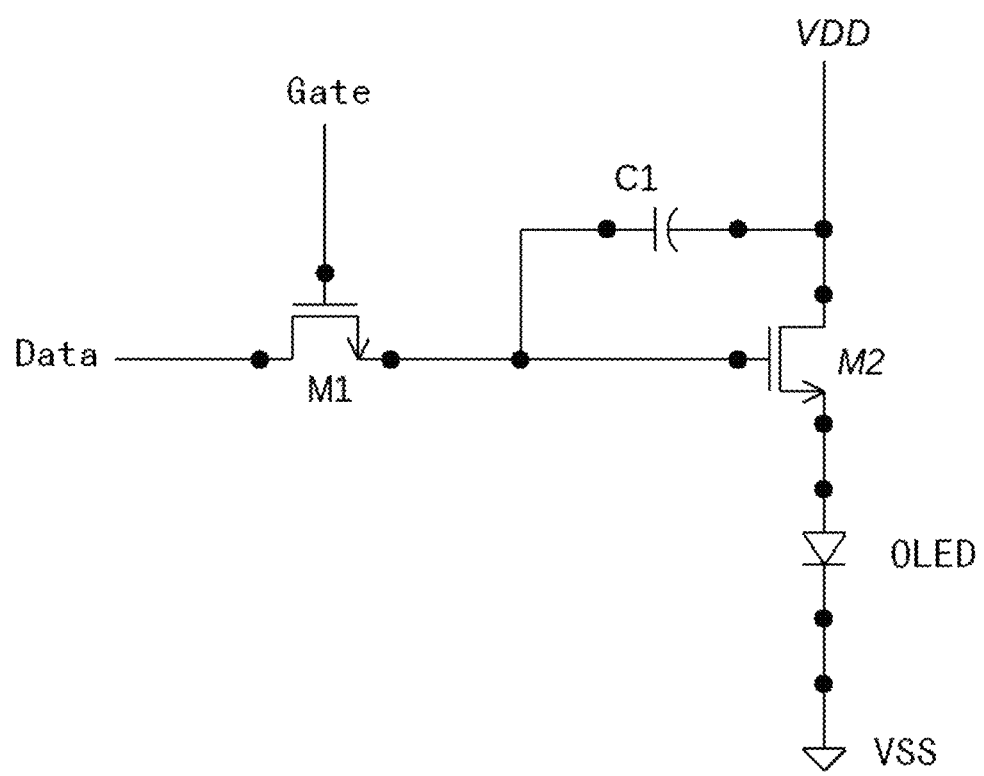
FIG. 3 is a schematic circuit diagram in a pixel region in the touch substrate embodiment of FIG. 2.

FIG. 3 illustrates a schematic diagram of a pixel driving unit. As shown in FIG. 3, the pixel driving unit includes a driving transistor M2, a switching transistor M1, and a storage capacitor C1. A control terminal of the switching transistor M1 is connected to a gate line Gate, a first terminal thereof is connected to a data line Data, and a second terminal thereof is connected to a control terminal of the driving transistor M2. A first terminal of the driving transistor M2 is connected to a first power supply terminal VDD, and a second terminal thereof is connected to an anode of a light emitting unit OLED. A cathode of the light emitting unit OLED is connected to a second power supply terminal VSS. A first end of the storage capacitor C1 is connected between the second terminal of the switching transistor M and the control terminal of the driving transistor M2, and a second end thereof is connected between the first terminal of the driving transistor M2 and the first power supply terminal VDD.

For a plurality of pixel driving units arranged in an array, the control terminals of the switching transistors M1 in the pixel driving units located in the same row are connected to the same gate line Gate, the first terminals of the switching transistors M1 in the pixel driving units located in the same column are connected to the same data line Data, and the second terminal of each switching transistor M1 is connected to the control terminal of a corresponding driving transistor M2.

It is to be noted that the foregoing is merely illustration based on an example in which the pixel driving unit includes a 2T1C pixel circuit, and that the pixel driving unit is not so limited. As will be appreciated by those skilled in the art, the pixel driving unit may be a 6T2C pixel circuit, a 4T2C pixel circuit, or the like, which will not be described in detail herein.

In an exemplary embodiment of the present disclosure, the switching transistor M1 and the driving transistor M2 in the pixel driving unit are disposed in the same layer as the read transistor 2 in the touch unit. Specifically, the control terminal of the switching transistor M1 and the control terminal of the driving transistor M2 are in the same layer as the control terminal of the read transistor 2, and the first and second terminals of the switching transistor M1 and the first and second terminals of the driving transistor M2 are in the same layer as the first and second terminals of the read transistor 2, and the active layer of the switching transistor M1 and the active layer of the driving transistor M2 are in the same layer as the active layer of the read transistor 2. As a result, the thickness of the touch substrate can be significantly reduced, which facilitates thinning of the display device. Moreover, the switching transistor M1 and the driving transistor M2 in the pixel driving unit and the read transistor 2 in the touch unit can be prepared in one-time manufacturing process, thereby increasing the productivity and reducing the production cost.

In an exemplary embodiment of the present disclosure, the data line Data may be disposed in the same layer as the read signal line 5. For example, the data line Data may be disposed in parallel with the read signal line in a column direction. The gate line Gate may be disposed in the same layer as the driving signal line 4. For example, the gate line Gate may be disposed in parallel with the driving signal line 4 in a row direction. Such an arrangement can simplify the wiring of the touch substrate and make it more uniform, thereby contributing to display uniformity.

According to another exemplary embodiment of the present disclosure, there is provided a display device including any of the touch substrates described above.

In the display device provided by an embodiment of the present disclosure, the light emitting units are located above the touch units. That is, in preparing the touch substrate, unlike the conventional technique of preparing the light emitting units first and then preparing the touch units, the touch units may be prepared first, and then the light emitting units are prepared. Therefore, the orthographic projection of the touch unit and that of the light emitting unit on the substrate can overlap without affecting the display function of the touch substrate, and thus the aperture ratio and the resolution of the touch substrate can be improved.

The display device may be any product or component having a display function such as an OLED panel, a mobile phone, a tablet computer, a television, a display, a notebook computer, a digital photo frame, a navigator, and the like.

According to a further exemplary embodiment of the present disclosure, a method for manufacturing a touch substrate is provided, which includes providing a substrate; providing a touch unit on the substrate; and providing a light emitting unit above the touch unit. The orthographic projection of the touch unit and that of the light emitting unit on the substrate at least partially overlap.

In the touch substrate manufactured by such a method, unlike the conventional technique of preparing the light emitting units first and then preparing the touch units, the touch units may be prepared first, and then the light emitting units are prepared. Thus, the orthographic projection of the touch unit and that of the light emitting unit on the substrate can overlap without affecting the display function of the touch substrate, and thus the aperture ratio and the resolution of the touch substrate can be improved.

In an exemplary embodiment, providing a touch unit on the substrate may include providing a read transistor and a photosensitive device, with the first terminal of the read transistor being connected to the photosensitive device, the second terminal of the read transistor being connected to a read a signal line, and the control terminal of the read transistor being connected to a driving signal line.

In an exemplary embodiment, providing the photosensitive device may include disposing a second electrode, a photosensitive layer, and a first electrode on the substrate successively. In this case, the method further includes disposing an insulating layer on the first electrode of the photosensitive device; providing in the insulating layer a via penetrating the insulating layer to connect the second terminal of the read transistor to the first electrode of the photosensitive device.

In an exemplary embodiment, the above method may further include providing a pixel driving unit between the light emitting unit and the photosensitive device. The pixel driving unit includes a switching transistor and a driving transistor, with the switching transistor, the driving transistor, and the read transistor being formed in the same process step. Specifically, the control terminal of the switching transistor, the control terminal of the driving transistor, and the control terminal of the read transistor are formed in the same process step, the first and second terminals of the switching transistor, the first and second terminals of the driving transistor, and the first and second terminals of the read transistor are formed in the same process step, and the active layer of the switching transistor, the active layer of the driving transistor and the active layer of the read transistor are formed in the same process step.

By forming the switching transistor, the driving transistor and the read transistor in the same process step, the thickness of the touch substrate can be significantly reduced, thereby facilitating thinning of the display device, increasing the productivity, and reducing the production cost.

In an exemplary embodiment, the above method may further include providing a plurality of gate lines and a plurality of data lines that intersect and are insulated from each other; and providing a plurality of driving signal lines and a plurality of read signal lines. The touch units are arranged in an array. The control terminals of the read transistors of the touch units located in the same row are connected to the same driving signal line, and the second terminals of the read transistors of the touch units located in the same column are connected to the same read signal line. The data line and the read signal line are formed in the same process step, and the gate line and the driving signal line are formed in the same process step.

By forming the data line and the read signal line in the same process step, and forming the gate line and the driving signal line in the same process step, the manufacturing process can be notably simplified, and the production cost can be reduced.

It is to be understood that the above embodiments are merely exemplary embodiments provided to illustrate the principles of the present disclosure, and that the present disclosure is not so limited. Various modifications and improvements can be made by those ordinarily skilled in the art without departing from the spirit and essence of the present disclosure, and such modifications and improvements are also regarded as falling within the scope of the present disclosure.

What is claimed is:

1. A touch substrate, comprising:
   a substrate; and
   a touch unit and a light emitting unit that are on the substrate,
   wherein an orthographic projection of the touch unit and an orthographic projection of the light emitting unit on the substrate at least partially overlap,
   wherein the touch unit comprises a read transistor and a photosensitive device, a first terminal of the read transistor is connected to the photosensitive device, a second terminal of the read transistor is connected to a read signal line, and a control terminal of the read transistor being connected to a driving signal line, and
   wherein the photosensitive device comprises a second electrode on the substrate, a photosensitive layer on a side of the second electrode facing away from the substrate, and a first electrode on a side of the photosensitive layer facing away from the substrate, the first electrode of the photosensitive device is connected to the first terminal of the read transistor, and the first terminal of the read transistor is on a side of the first electrode of the photosensitive device facing away from the substrate.

2. The touch substrate of claim 1,
   further comprising an insulating layer on the first electrode of the photosensitive device, the first terminal of the read transistor being connected to the first electrode of the photosensitive device through a via penetrating the insulating layer.

3. The touch substrate of claim 1, comprising a plurality of the touch units, wherein the plurality of touch units is in an array,
   control terminals of the read transistors of the touch units in a same row are connected to a same driving signal line, and
   a plurality of second terminals of the read transistors of the touch units in a same column are connected to a same read signal line.

4. The touch substrate of claim 1, further comprising a plurality of gate lines and a plurality of data lines that intersect and are insulated from each other, and a plurality of pixel driving units in areas defined by intersections of the gate lines and the data lines, wherein each of the pixel driving units is connected to a corresponding gate line, data line, and light emitting unit, and is configured to output a data signal input on the data line to the light emitting unit under control of a control signal input by the gate line so as to drive the light emitting unit to emit light.

5. The touch substrate of claim 4, wherein each pixel driving unit is between the corresponding light emitting unit and the corresponding photosensitive device.

6. The touch substrate of claim 4, wherein each pixel driving unit comprises a switching transistor and a driving transistor,
   the switching transistor and the driving transistor each comprising a first terminal, a second terminal and a control terminal,
   the control terminal of the switching transistor and the control terminal of the driving transistor being in a same layer as the control terminal of the read transistor,
   the first and second terminals of the switching transistor and the first and second terminals of the driving transistor being in a same layer as the first and second terminals of the read transistor, and an active layer of the switching transistor and an active layer of the driving transistor being in a same layer as an active layer of the read transistor.

7. The touch substrate of claim 4, wherein the data lines are in a same layer as the read signal lines, and the gate lines are in a same layer as the driving signal lines.

8. The touch substrate of claim 1, wherein the light emitting unit is an organic electroluminescent diode.

9. A display device comprising the touch substrate of claim 1.

10. A method for manufacturing a touch substrate, comprising:
providing a substrate;
providing a touch unit on the substrate; and
providing a light emitting unit above the touch unit,
wherein an orthographic projection of the touch unit and an orthographic projection of the light emitting unit on the substrate at least partially overlap,
wherein the touch unit comprises a read transistor and a photosensitive device, a first terminal of the read transistor is connected to the photosensitive device, a second terminal of the read transistor is connected to a read signal line, and a control terminal of the read transistor being connected to a driving signal line, and
wherein the photosensitive device comprises a second electrode on the substrate, a photosensitive layer on a side of the second electrode facing away from the substrate, and a first electrode on a side of the photosensitive layer facing away from the substrate, the first electrode of the photosensitive device is connected to the first terminal of the read transistor, and the first terminal of the read transistor is on a side of the first electrode of the photosensitive device facing away from the substrate.

11. The method of claim 10, further comprising:
providing an insulating layer on the first electrode of the photosensitive device; and
disposing in the insulating layer a via penetrating the insulating layer so as to connect the second terminal of the read transistor to the first terminal of the photosensitive device.

12. The method of claim 10, further comprising providing a pixel driving unit between the light emitting unit and the photosensitive device, the pixel driving unit comprising a switching transistor and a driving transistor, wherein:
a control terminal of the switching transistor, a control terminal of the driving transistor, and the control terminal of the read transistor are formed in a same process step,
a first terminal and a second terminal of the switching transistor, a first terminal and a second terminal of the driving transistor, and the first terminal and the second terminal of the read transistor are formed in a same process step, and
an active layer of the switching transistor, an active layer of the driving transistor, and an active layer of the read transistor are formed in a same process step.

13. The method of claim 10, further comprising:
providing a plurality of gate lines and a plurality of data lines that intersect and are insulated from each other; and
providing a plurality of driving signal lines and a plurality of read signal lines,
wherein:
a plurality of the touch units is in an array,
a plurality of control terminal of the read transistors of the touch units in a same row are connected to a same driving signal line,
second terminals of the read transistors of the touch units in a same column are connected to a same read signal line,
the plurality of data lines and the plurality of read signal lines are formed in a same process step, and
the plurality of gate lines and the plurality of driving signal lines are formed in a same process step.

14. The display device of claim 9, wherein
the touch substrate further comprises an insulating layer on the first electrode of the photosensitive device, the first terminal of the read transistor being connected to a first electrode of the photosensitive device through a via penetrating the insulating layer.

15. The display device of claim 9, wherein the touch substrate comprises a plurality of the touch units, wherein the plurality of touch units is in an array,
control terminals of the read transistors of the touch units in a same row are connected to a same driving signal line, and
a plurality of second terminals of the read transistors of the touch units in a same column are connected to a same read signal line.

16. The display device of claim 9, further comprising a plurality of gate lines and a plurality of data lines that intersect and are insulated from each other, and a plurality of pixel driving units in areas defined by intersections of the gate lines and the data lines, wherein each of the pixel driving units is connected to a corresponding gate line, data line, and light emitting unit, and is configured to output a data signal input on the data line to the light emitting unit under control of a control signal input by the gate line so as to drive the light emitting unit to emit light.

17. The display device of claim 16, wherein each pixel driving unit comprises a switching transistor and a driving transistor, the switching transistor and the driving transistor each comprising a first terminal, a second terminal and a control terminal, the control terminal of the switching transistor and the control terminal of the driving transistor being in a same layer as the control terminal of the read transistor, the first and second terminals of the switching transistor and the first and second terminals of the driving transistor being in a same layer as the first and second terminals of the read transistor, and an active layer of the switching transistor and an active layer of the driving transistor being in a same layer as an active layer of the read transistor.

* * * * *